July 27, 1965 G. E. BALL 3,197,690
SIGNAL TRANSLATING CIRCUIT FOR PROVIDING ISOLATION BETWEEN D.C. SOURCE AND LOAD
Filed March 1, 1963
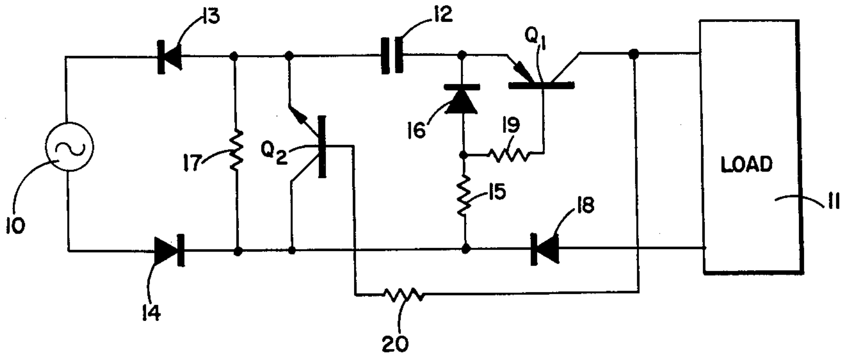
INVENTOR.
GARY E. BALL
BY A M Fernandez
ATTORNEY United States Patent Office 3,197,690
Patented July 27, 1965

3,197,690

SIGNAL TRANSLATING CIRCUIT FOR PROVIDING ISOLATION BETWEEN D.C. SOURCE AND LOAD

Gary E. Ball, Long Beach, Calif., assignor to North American Aviation, Inc.

Filed Mar. 1, 1963, Ser. No. 261,957
10 Claims. (Cl. 320—1)

This invention pertains to a signal translating circuit and in particular to a circuit which provides direct current isolation between a source of alternating signals and a load.

Direct current isolation is generally provided as required between an alternating signal source and a load by inductive coupling through a transformer; however, in many applications, such as where space or weight is important, it is desirable to provide a transformerless circuit for translating an alternating current signal through a load. For instance, in an aircraft or missile control system it may be desirable to modulate and demodulate an analog signal without direct current conduction between the modulating signal source and the switching circuits employed for modulation or demodulation.

Accordingly, it is an object of this invention to provide a signal translating circuit having isolation of direct current between its input and output terminals.

It is a further object to provide an efficient circuit for charging a capacitor from a signal source and effectively discharging it into a load.

The foregoing objects are achieved by coupling a capacitor to an alternating signal source and a load in such a manner as to alternately charge it from the source and discharge it into the load. Undirectional conductive elements coupling the signal source to the capacitor are so poled as to allow it to be charged only during alternate half cycles. A transistor coupling the capacitor to the load allows it to be discharged during the other half cycles. Reverse bias for the transistor during the charging period is provided by a unidirectional conductive impedance element connected in series with the capacitor, but in parallel with the emitter base junction of the transistor, when changing current ceases to flow through the unidirectional conductive impedance element, reverse bias is no longer applied to the transistor thereby allowing the capacitor to discharge into the base of the transistor through its emitter. In that manner a corresponding current is translated through the collector of the transistor and the load.

A large resistor is connected in parallel with the capacitor and the unidirectional conductive impedance element in order to complete discharge path. Such a resistor consumes a large amount of power; therefore, in order to eliminate the resistor from the discharge path of the capacitor once discharge is initiated, a second transistor of a conductivity type opposite to the first transistor is connected in parallel with the resistor. The base of the second transistor is connected to the collector of the first transistor for forward biasing current once conduction of the first transistor has been initiated. A regenerative action ensues between the two transistors rapidly driving both into further conduction, thereby shunting the large resistor.

A preferred embodiment of the invention is illustrated in the sole figure of the drawings in which a signal source 10 is coupled to a load 11. The signal source may be, for example, a sine wave generator or a square wave generator for modulating a signal in the load. Although the preferred embodiment is schematically illustrated as comprising a number of components interconnected between the signal source and the load, it should be understood that it could be advantageously produced as an integrated circuit using a semiconductor body out of which the components may be made.

A capacitor 12 is connected to the signal source 10 by a pair of series connected diodes 13 and 14 in order that the capacitor may be charged only during alternate half cycles. The charging path through the diodes 13 and 14 includes a resistor 15 connected in a series with the capacitor 12 by a diode 16. A large resistor 17 is connected in series with the diodes 13 and 14, and in parallel with the series circuit comprising the capacitor 12, resistor 15 and diode 16. The resistor 15 is very small as compared to the resistor 17 so that when the diodes 13 and 14 are forward biased, the capacitor 12 is quickly charged to almost the voltage amplitude of the signal. During the next half cycle, the diodes 13 and 14 are reverse biased thereby isolating the capacitor 12 from the source 10.

The load 11 is coupled to the capacitor 12 by a PNP transistor $Q_1$ and a diode 18 both of which are blocked or cut-off during the first half cycle of the signal from the source 10. The diode 18 is blocked or cut-off because it is poled opposite to the diode 14. The transistor $Q_1$ is blocked or cut-off because its base electrode is connected to a junction between the resistor 15 and the diode 16 by a resistor 19. Accordingly, while the capacitor 12 is charging and current is flowing through the diode 16, the base electrode of the transistor $Q_1$ is maintained positive with respect to its emitter electrode.

The initial discharge path of the capacitor 12 is through the emitter-base junction of the transistor $Q_1$ and the resistors 19, 15 and 17 connected in series. The diode 16 is reverse biased during the discharge of the capacitor owing to the reverse bias applied thereto by the capacitor through the transistor $Q_1$ and the resistors 15 and 17. The emitter current through the transistor $Q_1$ causes a corresponding collector current to flow through the load 11 substantially equal to the emitter current since the current gain of a junction transistor is equal to approximately 0.95.

An NPN transistor $Q_2$ is connected in parallel with the resistor 17 in order to provide a means for shunting it once conduction through the transistor $Q_1$ has been initiated. That is accomplished by connecting its base electrode to the collector electrode of the transistor $Q_1$ through a resistor 20 so that when conduction through the transistor $Q_1$ is initiated, base current is provided for the operation of the transistor $Q_2$. Conduction of the transistor $Q_2$ decreases the impedance of the discharge path for the capacitor 12, thereby increasing the emitter current of the transistor $Q_1$ and the base current of the transistor $Q_2$. The regeneration which ensues rapidly drives both into further conduction, thereby quickly shunting the large resistor 17 to diminish the power consumed by a factor of about six.

While the principles of the invention have now been made clear in an illustrative embodiment, obvious modifications particularly adapted for specific applications, environments and operating requirements may be made without departing from those principles. The appended claims are therefore intended to embrace any such modifications.

What is claimed is:

1. A direct current isolating circuit for translating an alternating current signal from a source to a load comprising a capacitor, first means coupling said capacitor to said source for charging said capacitor, said means including a diode having one terminal connected to a first side of said capacitor, second means coupling said capacitor to said load for discharging said capacitor, said second means including a first transistor connecting a junction between said diode and capacitor on one side of said capacitor to said load, and an impedance element connected in series to the other side of said capacitor for return of discharge current through the load, and third means connecting said diode in parallel with the emitter-base junction of said transistor, said diode being poled for conduction opposite to conduction through said emitter-base junction, whereby said transistor is rendered non-conductive while said capacitor is charging through said diode.

2. A signal translating circuit as defined in claim 1 including a second transistor having its emitter-collector circuit connected in parallel with said impedance element, and means coupling the collector of said first transistor to the base of said second transistor for rendering said second transistor conductive only when said first transistor is conducting, thereby shunting said resistor when discharge through said load is initiated.

3. A circuit for translating an alternating signal from a source to a load comprising a series circuit including a capacitor and a first unidirectional conducting means, a second unidirectional conducting means coupling said circuit to said source, whereby said capacitor is charged during alternate half cycles of a given polarity, a circuit including a transistor and a resistor for discharging said capacitor through said load, said transistor having its emitter connected to a junction between said capacitor and first unidirectional conducting means and its collector connected to said load, and said resistor being connected in parallel with said series circuit, and means for connecting the emitter-base junction of said transistor in parallel with said first unidirectional conducting means, said transistor being of a conductivity type selected to provide an emitter-base current opposite the conduction of current through said first unidirectional conducting means, whereby said transistor is rendered non-conductive only while said capacitor is charging.

4. A signal translating circuit as defined in claim 3 including a second transistor having its emitter-collector circuit connected in parallel with said resistor, and means coupling the collector of said first transistor to the base of said second transistor for rendering said second transistor conductive while said first transistor is conducting, thereby shunting said resistor when discharge through said load is initiated.

5. A signal translating circuit comprising an alternating signal source, a capacitor coupled to said source by a first unidirectional conducting means for charging during alternate half cycles of a given polarity via a charging path including a second unidirectional conducting means, a first transistor of a given conductivity type coupling said capacitor to a load for discharging during alternate half cycles of a polarity opposite said given polarity via a discharge path including a resistor in parallel with said capacitor and second unidirectional conducting means, and means for connecting said second unidirectional conducting means in parallel with the emitter-base junction of said transistor, said second unidirectional conducting means being poled for conduction opposite the conduction through said emitter-base junction diode, whereby said transistor is rendered non-conductive while said capacitor is charging.

6. A signal translating circuit as defined in claim 5 including a second transistor of a condutcivity type complementary to said given conductivity type, said second transistor being connected in parallel with said resistor in said discharge path, and means for connecting the base of said second transistor to the collector of said first transistor, whereby said second transistor is rendered conductive to shunt said resistor when said first transistor conducts to discharge said capacitor into said load.

7. A signal translating circuit comprising a series circuit including capacitor and a first unidirectional conducting means connected in series, a second unidirectional conducting means for coupling said series circuit to a source of alternating current for charging said capacitor during alternate half cycles of a given polarity, a resistor connected in parallel with said series circuit, a transistor of a given conductivity type having its emitter connected to a junction between said capacitor and first unidirectional conducting means, and its collector connected to a load for discharging said capacitor through a path including said load and said resistor in series circuit, and means for connecting said first unidirectional conducting means in parallel with the emitter-base junction of said transistor, said first unidirectional conducting means being poled for conduction opposite the conduction through said emitter-base junction, whereby said transistor is rendered non-conductive while said capacitor is charging.

8. A signal translating circuit as defined in claim 7 including a second transistor of a conductivity type complementary to said given conductivity type, said second transistor being connected in parallel with said resistor in said discharge path, and means for connecting the base of said second transistor to the collector of said first transistor, whereby said second transistor is rendered conductive to shunt said resistor when said first transistor conducts to discharge said capacitor into said load.

9. A direct current isolating circuit for translating an alternating signal from a source to a load comprising a capacitor, a first diode connected in a series circuit with said capacitor, second and third diodes coupling said series circuit for charging said capacitor during alternate half cycles of a given polarity of said signal, a resistor connected in parallel with said series circuit, a transistor of a given conductivity type having its emitter connected to a junction between said capacitor and said first diode, and its collector connected to a load for discharging said capacitor through a path including said load coupled to said resistor by a fourth diode, and means for connecting said first diode in parallel with the emitter-base junction of said transistor, said first diode being poled for conduction opposite the conduction through said emitter-base junction, whereby said transistor is rendered non-conductive while said capacitor is charging.

10. A signal translating circuit as defined in claim 9 including a second transistor of a conductivity type complementary to said given conductivity type, said second transistor being connected in parallel with said resistor in said discharge path, and means for connecting the base of said second transistor to the collector of said first transistor, whereby said second transistor is rendered conductive to shunt said resistor when said first transistor conducts to discharge said capacitor into said load.

No references cited.

ARTHUR GAUSS, *Primary Examiner.*